(12) United States Patent
Aruga

(10) Patent No.: US 7,869,479 B2
(45) Date of Patent: *Jan. 11, 2011

(54) OPTICAL MODULE

(75) Inventor: Hiroshi Aruga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 358 days.

This patent is subject to a terminal disclaimer.

(21) Appl. No.: 12/018,384

(22) Filed: Jan. 23, 2008

(65) Prior Publication Data

US 2008/0137699 A1    Jun. 12, 2008

Related U.S. Application Data

(63) Continuation of application No. 11/342,865, filed on Jan. 31, 2006, now Pat. No. 7,366,215.

(30) Foreign Application Priority Data

Feb. 4, 2005    (JP) .............................. 2005-029112

(51) Int. Cl.
*H01S 3/00*    (2006.01)
(52) U.S. Cl. ................ 372/38.1; 372/38.02; 372/38.05; 372/43.01; 372/50.124; 372/82
(58) Field of Classification Search .............. 372/38.02, 372/38.1, 38.05, 43.01, 50.124, 82
See application file for complete search history.

(56) References Cited

U.S. PATENT DOCUMENTS

| 3,459,942 A | 8/1969 | Anderson |
| 5,926,308 A | 7/1999 | Lee et al. |
| 6,101,295 A | 8/2000 | Mineo et al. |
| 7,139,296 B2 | 11/2006 | Iwafuji |
| 2003/0165167 A1* | 9/2003 | Ichikawa et al. .............. 372/36 |
| 2004/0037334 A1* | 2/2004 | Funada et al. ................. 372/43 |
| 2004/0247004 A1 | 12/2004 | Keh et al. |
| 2005/0013561 A1 | 1/2005 | Kuhara et al. |
| 2005/0064657 A1 | 3/2005 | Miyazawa |
| 2005/0067698 A1 | 3/2005 | Aruga et al. |

(Continued)

FOREIGN PATENT DOCUMENTS

JP    4-279075 A    10/1992

(Continued)

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

An optical module includes a stem; a first lead pin and a second lead pin for receiving differential signals, the first and second lead pins penetrating the stem; a mount block fixed to the stem; a laser diode having a pair of electrodes; a submount mounted on the mount block and having an interdigital capacitor, and a plurality of electrode patterns on a surfaces on the submount; and a first wire and a second wire electrically connecting the submount to the first and second lead pins, respectively. The laser diode is mounted on one of the electrode patterns on the submount and connected to another one of the electrode patterns on the submount by a third wire such that the laser diode and the interdigital capacitor form an electrical circuit. The interdigital capacitor has a capacitance selected to reduce signal reflection at a selected frequency.

2 Claims, 4 Drawing Sheets

U.S. PATENT DOCUMENTS

| | | |
|---|---|---|
| 2005/0121684 A1 | 6/2005 | Aruga et al. |
| 2006/0007516 A1 | 1/2006 | Kagaya et al. |

FOREIGN PATENT DOCUMENTS

| | | | |
|---|---|---|---|
| JP | 8-116136 A | | 5/1996 |
| JP | 11-38372 | | 2/1999 |
| JP | 2002-343983 A | | 11/2002 |
| JP | 2003-304105 A | | 10/2003 |
| JP | 2004047832 A | * | 2/2004 |
| JP | 2004-259880 | | 9/2004 |

* cited by examiner

CHANGING VALUE OF MATCHING RESISTANCE 11
IMPEDANCE OF SIGNAL SOURCE: 50 Ω (DIFFERENTIAL)
INDUCTANCE OF WIRE BOND 9c: 0.5 nH

CHANGING CAPACITANCE OF CAPACITOR 12
IMPEDANCE OF SIGNAL SOURCE: 50 Ω (DIFFERENTIAL)
VALUE OF MATCHING RESISTANCE 11: 20 Ω

OPTICAL MODULE

BACKGROUND OF THE INVENTION

1. Field of the Invention

The present invention relates to an optical module employing a laser diode device, and more particularly to an optical module used for high speed optical communications, which require impedance matching.

2. Background Art

In recent years, there has been a need to reduce the power consumption and the size of optical modules for communications employing a laser diode device (or LD device), as well as to increase the speed of the modulating signal (more than 10 GHz).

Because the faster speed of the modulating signal handled by an optical module includes the more high frequency components in the modulating signal, the transmission lines etc. within the optical module must be impedance matching well for high frequency signals.

Therefore, conventional optical modules are configured such that: a matching resistance is provided between the LD device and the driver circuit for driving the LD device; and the combined impedance of the matching resistance and the LD device is set equal to the impedance of the driver circuit. For example, if the impedance of the driver circuit is 50 Ohms and the resistance value of the LD device is approximately 6 Ohms, then the matching resistance must be set to 44 Ohms. With the increasing speed of the modulating signal, it is advantageous and common practice that the transmission lines between the driver circuit and the LD device are designed to transmit differential signals to the LD device in order to achieve a stable electrical connection.

To reduce the power consumption of the optical module, it is preferable to reduce the matching resistance. However, reducing the matching resistance leads to an impedance mismatch. To compensate for this, a technique for impedance matching is proposed in which a low impedance line having a length approximately equal to ¼ wavelength is provided within the optical module (see, e.g., Japanese Patent Laid-Open No. 2004-259880 (FIG. 5)).

Another proposed technique for impedance matching is applied to conventional optical modules employing an electroabsorption (EA) modulator. According to this technique, an open stub is connected to a microstrip line constituting a transmission line to form a matching circuit (see, e.g., Japanese Patent Laid-Open No. 11-38372 (FIG. 1)).

Conventional optical modules including a matching resistance have a problem in that the value of the matching resistance must be increased as the reference impedance to be matched increases. Therefore, an increase in the matching resistance results in an increase in the power consumption of the device, because the LD device is current driven device.

In the case of the above conventional optical module in which the value of the matching resistance is reduced, on the other hand, it is necessary to add a low impedance line having a length approximately equal to ¼ wavelength. This increases the parts count and hence cost, and makes it difficult to reduce the size of the optical module.

Further, the above conventional optical module in which an open stub is connected to a microstrip line to form a matching circuit is intended for use at frequencies of 40 GHz and higher and is disadvantageous in that for the open stub to provide impedance matching at frequencies of 10 GHz and lower, it is necessary to increase the size of the substrate for the matching circuit. This increases the size of the circuit and parts cost, resulting in an increase in the cost of the entire optical module.

SUMMARY OF THE INVENTION

The present invention has been devised to solve the above problems. It is, therefore, an object of the present invention to provide a small, low-cost optical module and optical module submount having good high frequency characteristics and reduced power consumption.

According to one aspect of the present invention, an optical module includes a stem; a first lead pin and a second lead pin for supplying a differential signal, the first and second lead pins penetrating the stem; a mount block fixed to the stem; a laser diode having a pair of electrodes; a submount mounted on the mount block and having a matching resistance, an interdigital capacitor, and a plurality of electrode patterns formed on a surface thereof; and a first wire bond and a second wire bond for electrically connecting the submount to the first and second lead pins, respectively. The laser diode is mounted on one of the plurality of electrode patterns on the submount and connected to another one of the plurality of electrode patterns on the submount by a third wire bond such that the laser diode, together with the matching resistance and the interdigital capacitor, forms an electrical circuit. The value of the matching resistance is smaller than the impedance value of the differential signal minus the resistance value of the laser diode.

Other and further objects, features and advantages of the invention will appear more fully from the following description.

According to the present invention, the submount on which the LD device is mounted has a matching resistance and an interdigital capacitor formed thereon. The value of this matching resistance is set smaller than the impedance value of the signal source minus the resistance value of the LD device to reduce the power loss. Further, the capacitance of the capacitor is adjusted to prevent degradation in the signal reflection characteristic due to the reduction in the matching resistance. These arrangements allow the size of the optical module submount and the optical module to be reduced.

DETAILED DESCRIPTION OF THE PREFERRED EMBODIMENTS

First Embodiment

Figure 1:
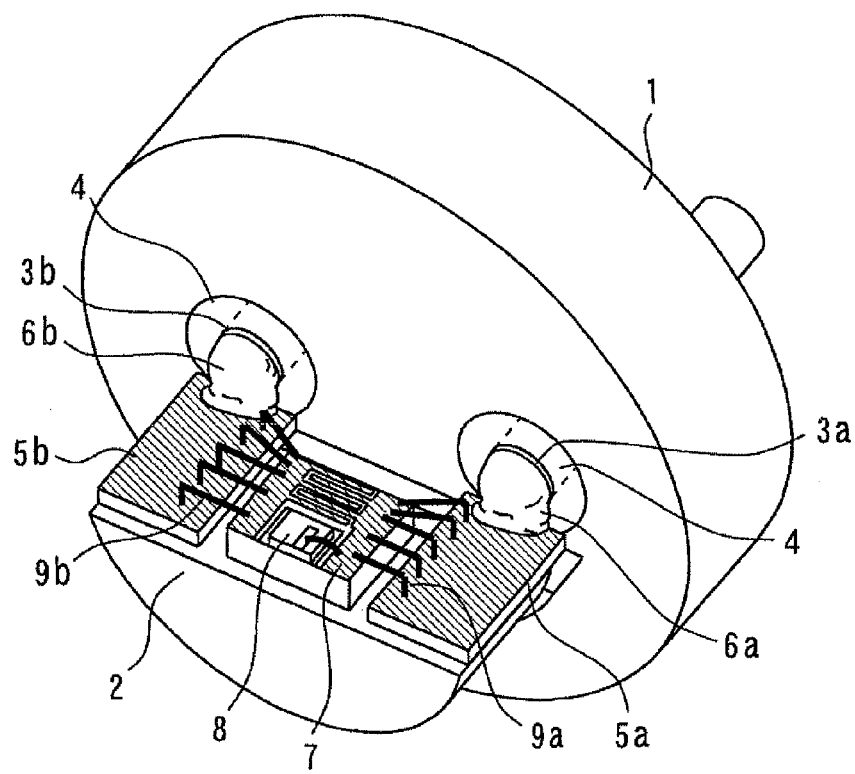
FIG. 1 is a perspective view of an optical module according to a first embodiment of the present invention.
Figure 2:
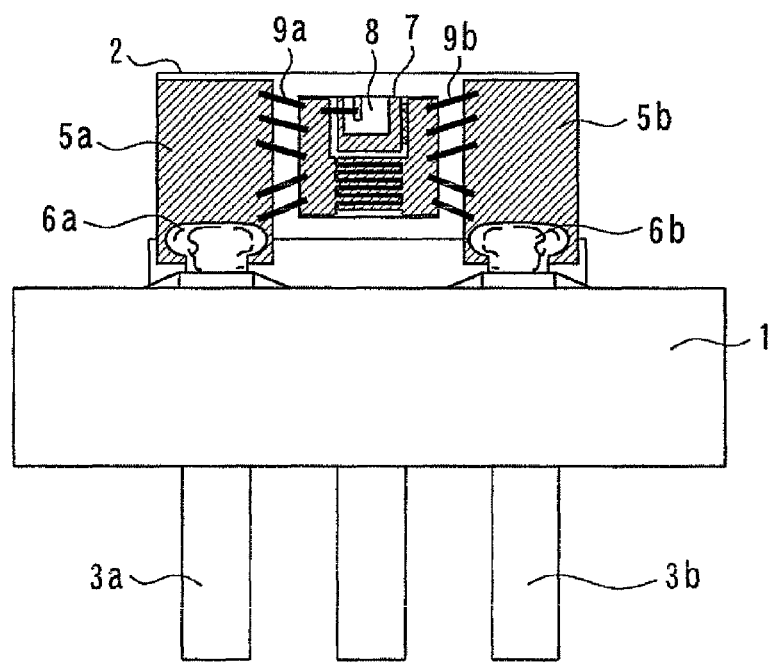
FIG. 2 is a plan view of the optical module shown in FIG. 1.

FIG. 1 is a perspective view of an optical module according to a first embodiment of the present invention; and FIG. 2 is a plan view of the optical module shown in FIG. 1.

Referring to FIGS. 1 and 2, a stem 1 has a mount block 2 fixed thereto and also has two lead pins 3a and 3b therethrough that enable for electrical connection to an external device and that transmit a differential signal to the optical module. Sealing glass 4 is filled between the lead pins 3a and 3b, and the through-holes of the stem 1, to fix the lead pins 3a and 3b to the stem 1 while electrically insulating them from each other and to seal between the inside and outside of the optical module. It should be noted that the cap (not shown) sealingly enclosing the mount block 2, etc. defines the exterior surface of the optical module.

Further, a submount 7 and interconnection substrates 5a and 5b are mounted on the mount block 2. The interconnection substrates 5a and 5b are disposed at positions corresponding to the lead pins 3a and 3b so as to sandwich the submount 7. The submount 7 is electrically connected to the interconnection substrates 5a and 5b through a plurality of wire bonds 9a and 9b, and the interconnection substrates 5a and 5b, in turn, are electrically connected to the lead pins 3a and 3b through conductive adhesives 6a and 6b, respectively. It should be noted that the interconnection substrates 5a and 5b form a microstrip line, and its impedance is adjusted to compensate, to the greatest extent possible, for the impedance mismatch with the portions constituting the lead pins 3a and 3b. Further, the conductive adhesives 6a and 6b may be replaced by solder.

Figure 3:
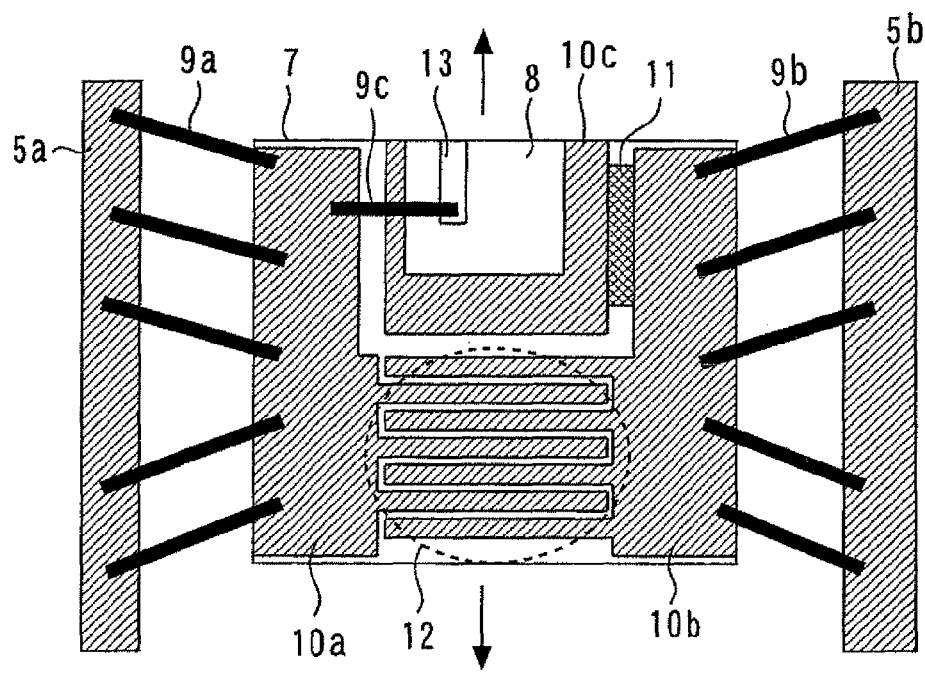
FIG. 3 is an enlarged view of the submount portion shown in FIG. 2.

The submount 7 has conductive patterns, capacitors, and thin-film resistors formed on its surface. A laser diode (or LD device) 8 is mounted on and electrically connected to the submount 7. The submount 7 and the laser diode 8 form an electrical circuit. There will now be described in detail the configuration and the electrical circuit of the submount 7 portion on which the LD device 8 is mounted with reference to FIG. 3. FIG. 3 is an enlarged view of the submount 7 portion shown in FIG. 2.

Referring to FIG. 3, the substrate of the submount 7 is formed of a dielectric material such as aluminum nitride (AlN), and first to third interconnection electrode pattern portions 10a, 10b, and 10c, a matching resistance 11, and a capacitor 12 are formed on the surface of the substrate. The first to third interconnection electrode pattern portions 10a, 10b, and 10c are made up of a conductive layer; the matching resistance 11 is made up of a thin-film resistor; and the capacitor 12 is made up of conductive layer patterns arranged in a comb-like fashion as shown in FIG. 3 (this type of capacitor is referred to as "interdigital capacitor"). More specifically, the matching resistance 11 is formed between the second interconnection electrode pattern portion 10b and the third interconnection electrode pattern portion 10c, while the capacitor 12 is formed between the first interconnection electrode pattern portion 10a and the second interconnection electrode pattern portion 10b.

The laser diode (LD) device 8 in the figure has electrodes on its principal surface and rear surface. A top electrode 13 of the device 8 corresponds to the electrode on the principal surface side. The LD device 8 is mounted on the third interconnection electrode pattern portion 10c of the submount 7 such that the rear electrode (not shown) of the LD device 8 is electrically connected to the third interconnection electrode pattern portion 10c. Further, the top electrode 13 on the LD device 8 is electrically connected to the first interconnection electrode pattern portion 10a of the submount 7 through a wire bond 9c. In this example, the top electrode 13 is a cathode and the rear electrode is an anode. Further, the LD device 8 emits light in the directions indicated by the arrows in the figure.

Further, the first and second interconnection electrode pattern portions 10a and 10b of the submount 7 are electrically connected to the interconnection substrates 5a and 5b through the plurality of wire bonds 9a and 9b, respectively, as described in connection with FIGS. 1 and 2.

The operation of the optical module will now be described. Two high frequency modulating signals are fed as differential signals and are supplied to the lead pins 3a and 3b, respectively. The signal supplied to the lead pin 3a is transmitted to the interconnection electrode pattern 10a on the submount 7 through the conductive adhesive 6a, the interconnection substrate 5a, and the wire bond 9a in that order. Then, the signal is further transmitted from the interconnection electrode pattern 10a to the top electrode (or cathode) 13 on the LD device 8 through the wire bond 9c. The signal supplied to the lead pin 3b, on the other hand, is transmitted to the interconnection electrode pattern 10b on the submount 7 through the conductive adhesive 6b, the interconnection substrate 5b, and the wire bond 9b in that order. Then, the signal is further transmitted from the interconnection electrode pattern 10b to the rear electrode (or anode) of the LD device 8 through the matching resistance 11 and the interconnection electrode pattern 10c. It should be noted that supplying the above signals to the first and second interconnection electrode patterns 10a and 10b results in a modulating signal being supplied to the capacitor 12. The LD device 8 generates optical power according to the differential high-frequency modulating signal thus supplied.

Figure 4:
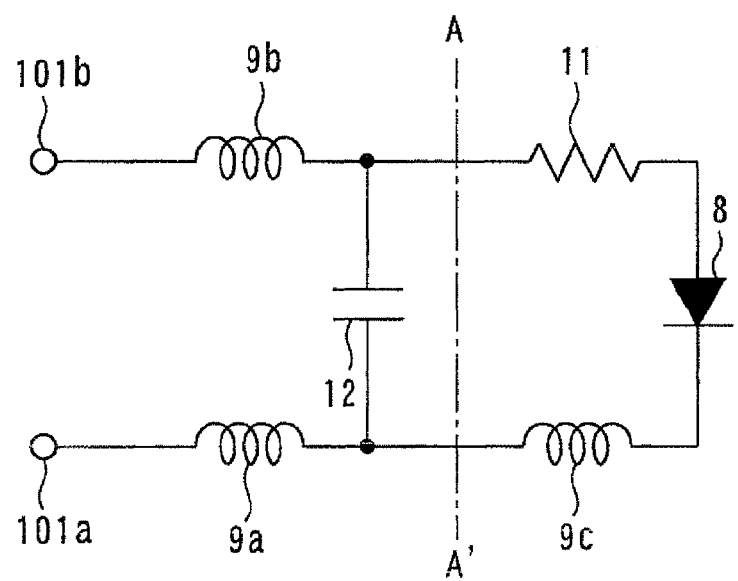
FIG. 4 shows an equivalent circuit of the optical module.

FIG. 4 shows an equivalent circuit of the optical module. It should be noted that in FIGS. 3 and 4, like numerals are used to denote like or corresponding components. In FIG. 4, the wire bonds 9a, 9b, and 9c are represented as inductive components. It should be further noted that input terminals 101a and 101b are assumed to be located on the interconnection substrates 5a and 5b, respectively. There will now be described simulation results of the circuit characteristics of the optical module under various conditions based on the equivalent circuit shown in FIG. 4.

A description is now given of the characteristics of the optical module when it does not include the capacitor 12 shown in FIG. 4. In this case, in order to achieve appropriate impedance matching to the signal source connected to the input terminals 101a and 101b, the sum of the value of the matching resistance 11 and the resistance value of the LD device 8 generally must be equal to the impedance value of the signal source. However, if the value of the matching resistance 11 is large, then so is the power consumed in the matching resistance. As a result, the optical module has increased power consumption.

Specifically, when the impedance of the driver circuit (or the signal source) is 50 Ohms and the resistance value of the LD device 8 is approximately 6 Ohms, the matching resistance 11 is typically set to 44 Ohms. In this case, the power consumed in the matching resistance 11 is calculated as follows. For example, when the average amount of current necessary to drive the LD device at a high temperature (80° C. or so) is 80 mA, the power consumption is calculated to be as much as approximately 280 mW using the equation: $P=I^2 \times R$, where P is the power consumption (W), I is the current (A), and R is the resistance (Ohm). Usually, the current flowing in the LD device depends on the magnitude of the optical output. Therefore, reducing the power consumption of the optical module requires reducing the value of the matching resistance 11 as much as possible.

Figure 5:
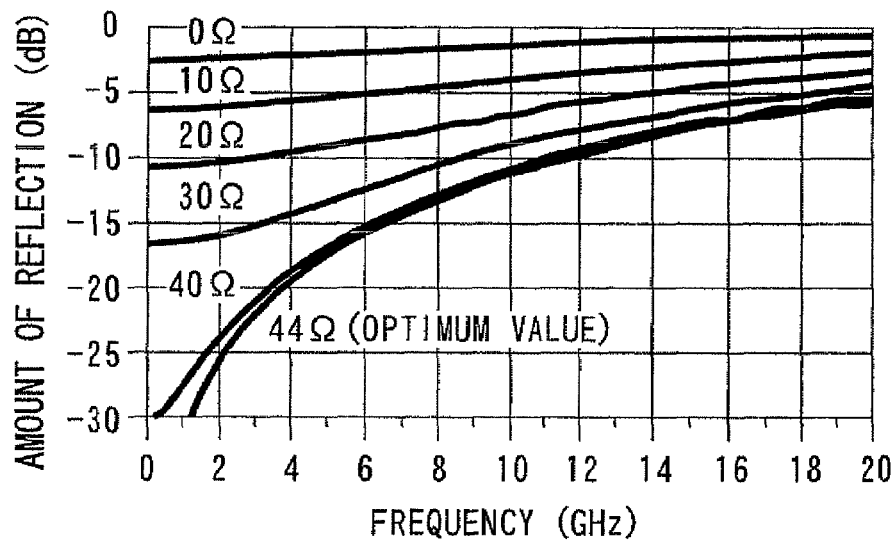
FIG. 5 shows the relationship between the value of the matching resistance and the reflection characteristic.

FIG. 5 shows the relationship between the value of the matching resistance 11 and the reflection characteristic (at frequencies from DC to 20 GHz). In the figure, the horizontal axis represents the signal frequency (GHz) and the vertical axis represents the amount of reflection (dB). (FIG. 5 shows how the signal frequency vs. amount of reflection characteristic changes as the value of the matching resistance 11 changes.) The amount of reflection (plotted on the vertical axis) is expressed as the ratio of the amount of reflected signal from the circuit to the amount of input signal to the circuit. That is, the smaller the amount of reflection, the better the matching conditions of the circuit.

FIG. 5 shows simulation results of the reflection characteristic of the optical module obtained by assuming that the signal source is connected to the portion of the circuit on the right side of line A-A' of FIG. 4 (including the LD device 8, the matching resistance 11, and the wire bond 9c, but not including the wire bonds 9a and 9c and the capacitor 12). Other conditions are such that: the impedance of the signal source is 50 Ohms; the resistance value of the LD device 8 is 6 Ohms; and the inductance of the wire bond 9c is 0.5 nH.

FIG. 5 indicates that the optimum resistance value for impedance matching, at which the amount of reflection is minimized, is approximately 44 Ohms. (The amount of reflection is calculated to be −10 dB or less at frequencies up to approximately 10 GHz.) If the amount of reflection is −10 dB or less, the reflected signal is relatively small and hence does not affect the passing characteristics very much. On the other hand, in order to reduce the power consumption, it is necessary to reduce the resistance value, as described above. However, if the value of the matching resistance 11 is reduced from 44 Ohms, the amount of reflection increases over the entire frequency range. Further, if the value of the matching resistance 11 is reduced to less than 20 Ohms, the amount of reflection exceeds −10 dB over the entire frequency range. That is, simply reducing the value of the matching resistance leads to degradation in the reflection characteristic, preventing an appropriate impedance matching level from being achieved. It should be noted that the amount of reflection increases as the frequency increases, since the inductive component of the wire bond 9c (impedance of which increases with increasing frequency) causes an impedance mismatch.

To compensate for this, the capacitor 12 is connected in parallel to the series circuit (formed on the submount 7) made up of the wire bond 9c, the LD device 8, and the matching resistance 11 connected in series. This arrangement allows one to prevent an increase in the amount of reflection at frequencies within a particular range by utilizing the resonance between the inductive component of the wire bond 9c and the capacitive component of the capacitor 12.

Figure 6:
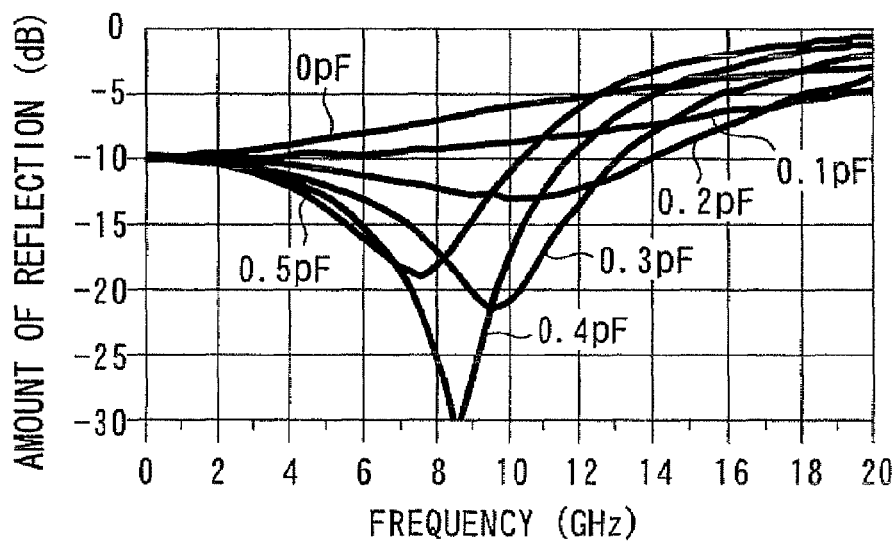
FIG. 6 shows how the amount of reflection changes with the capacitance of the capacitor.

FIG. 6 shows how the amount of reflection changes with the capacitance of the capacitor 12. The simulation conditions are such that: the impedance of the signal source, the resistance value of the LD device 8, and the inductance value of the wire bond 9c are the same as those described in connection with FIG. 5; and the matching resistance 11 is 20 Ohms.

FIG. 6 indicates that the amount of reflection is minimized (at around 8.5 GHz) when the capacitor 12 is 0.4 pF. However, at around 10 GHz, for example, the amount of reflection is smaller when the capacitor 12 is 0.3 pF than when it is 0.4 pF. That is, the reflection characteristic can be improved at selected frequencies by changing the capacitance of the capacitor 12.

Thus, connecting the capacitor 12 to the circuit allows the amount of reflection to be reduced even when the value of the matching resistance 11 is smaller than the conventional value (that is, the impedance value of the signal source minus the resistance value of the LD device). Thus, the reflection characteristic can be improved, allowing the optical module to have good high frequency characteristics and reduced power consumption.

Furthermore, the required capacitance of the capacitor 12 itself is very small (for example, 0.4 pF), as indicated above. Such a small capacitance need not be implemented by a discrete component. For example, it can be fully implemented by a so-called interdigital capacitor (12) made up of conductive patterns arranged on the submount 7 in a comb-like fashion.

Assume that an interdigital capacitor (12) with a capacitance of 0.4 pF is to be formed on the submount 7 employing a 0.25 mm thick substrate formed of aluminum nitride (having a relative permittivity $e_r$ of 8.8). The dimensions of the patterns of the interdigital capacitor (12) are assumed to be such that: the length of the fingers of the comb-like portions is 0.6 mm; the distance between two adjacent fingers is 0.02 mm; and the width of each finger is 0.02 mm. In this case, the capacitor only requires an area of approximately 0.6 mm×0.5 mm. It should be noted that general thin-film patterns can be formed to the above pattern dimensions.

Furthermore, since the patterns of the above capacitor are integrally formed with the matching resistance on the submount, their dimensional accuracy is very high and hence the capacitance varies very little, as compared to discrete components.

For the type of submount that has conductive patterns and a thin-film matching resistance formed on its surface, adding such a capacitor does not leads to an increase in the number of manufacturing steps. Further, since the capacitor has substantially no height, or thickness, as compared to a discrete component, it does not block the emitted light from the LD device 8 and hence can be disposed at a position on the optical axis of the LD device 8, as shown in FIG. 1, etc. Therefore, it is possible to reduce the size and cost of the submount. It goes without saying that use of such a small submount enables the optical module to be miniaturized while allowing it to have good high frequency characteristics and reduced power consumption.

It should be noted that although the interdigital capacitor 12 can be disposed at a position on the optical axis of the LD device 8 (as described above), the capacitor 12 is preferably installed on the rear light emitting side if the optical module includes optical components such as lenses, in order for the LD device 8 to be disposed close to these optical components.

Further according to the present embodiment, the low reflective submount 7 is connected to the lead pins 3a and 3b by use of the interconnection substrates 5a and 5b, respectively, each formed of a microstrip line whose impedance is suitably adjusted. With this arrangement, the impedance of the transmission lines from the lead pins 3a and 3b to the submount 7 (that is, to the interconnection electrode patterns 10a and 10b) can be set to match the impedance of the signal source, thereby allowing the optical module to have good high frequency characteristics. As a result, the optical module exhibits low reflectivity when connected to the signal source.

Second Embodiment

Figure 7:
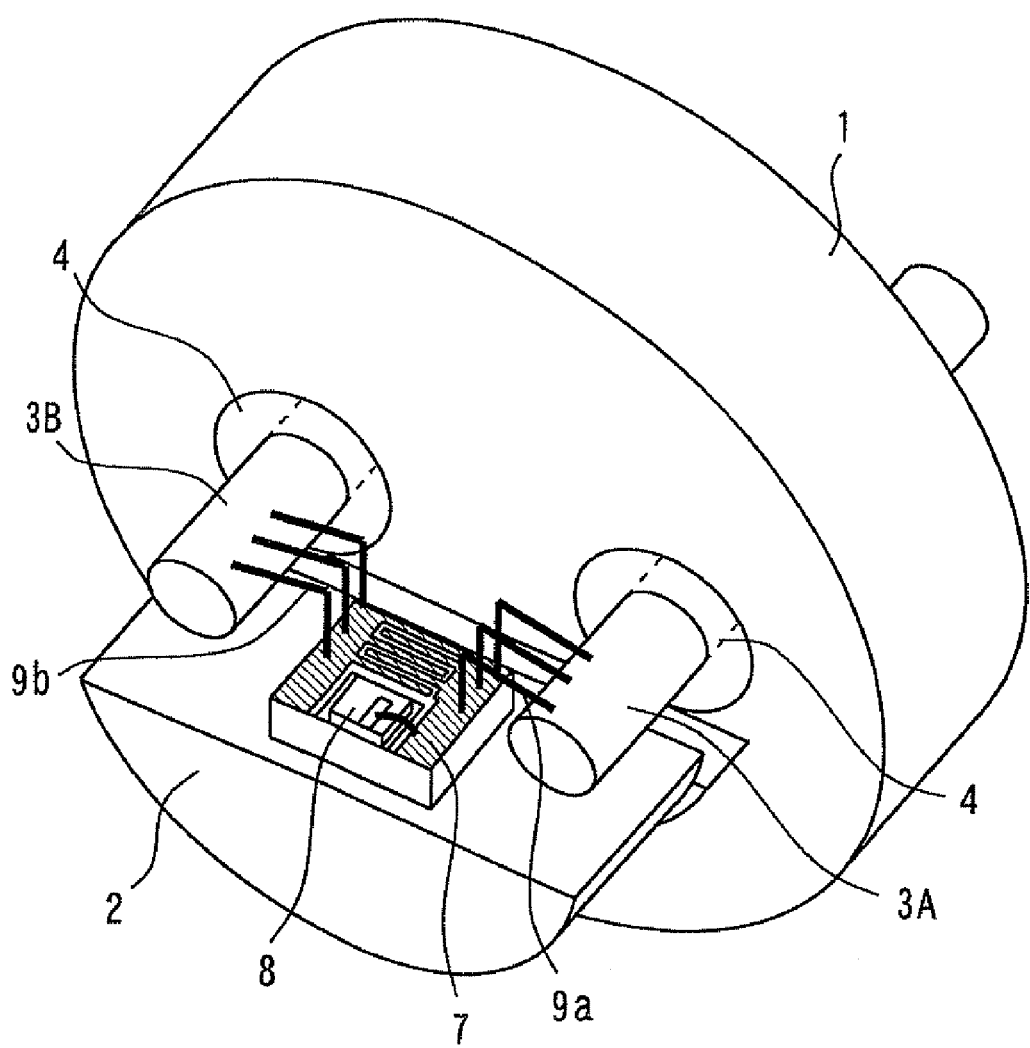
FIG. 7 is a perspective view of an optical module according to a second embodiment of the present invention.

FIG. 7 is a perspective view of an optical module according to a second embodiment of the present invention. According to the first embodiment, the submount 7 is electrically connected to the lead pins 3a and 3b through the interconnection substrates 5a and 5b, respectively, whose impedance is suitably adjusted, as described above. (The interconnection substrates 5a and 5b are disposed so as to sandwich the submount 7.) Therefore, the interconnection electrode patterns 10a and 10b of the submount 7 are connected to the interconnection substrates 5a and 5b by the wire bonds 9a and 9b, respectively. On the other hand, the optical module of the second embodiment is configured such that: the lead pins 3a and 3b (renamed as lead pins 3A and 3B) are extended so as to sandwich the submount 7; and these lead pins 3A and 3B are directly connected to the interconnection electrode patterns 10a and 10b by the wire bonds 9a and 9b, respectively. It should be noted that all other components are similar to those described in connection with the first embodiment.

Generally, the inductance of the lead pins 3A and 3B are large, since these lead pins 3A and 3B considerably protrude into the air (as compared to the original lead pins 3a and 3b). This may affect the impedance matching. However, the capacitance of the capacitor 12 disposed on the submount 7 can be adjusted to compensate for the inductance of the wire bonds 9a and 9b and the lead pins 3A and 3B, as well as the inductance of the wire bond 9c. This makes it easy to manufacture a lower cost optical module made up of fewer parts.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-029112, filed on Feb. 4, 2005 including specification, claims, drawings and summary, on which the Convention priority of the present application is based, are incorporated herein by reference in its entirety.

What is claimed is:

1. An optical module comprising:
   a stem;
   a first lead pin and a second lead pin for receiving differential signals, the first and second lead pins penetrating the stem;
   a mount block fixed to the stem;
   a laser diode having a pair of electrodes, the laser diode having a resistance;
   a submount mounted on the mount block and having an interdigital capacitor and a plurality of electrode patterns on a surface of the submount;
   a first wire and a second wire electrically connecting the submount to the first and second lead pins, respectively, wherein
   the laser diode is mounted on a first of the plurality of electrode patterns on the submount such that the laser diode and the interdigital capacitor form an electrical circuit, and
   the interdigital capacitor has a capacitance selected to reduce signal reflection at a selected frequency;
   a first interconnection substrate and a second interconnection substrate located on the mount block, sandwiching the submount, wherein
   the first and second interconnection substrates are electrically connected to the first and second lead pins, respectively, and
   the submount is connected to the first and second interconnection substrates by the first and second wires, respectively.

2. An optical module comprising:
   a stem;
   a first lead pin and a second lead pin for receiving differential signals, the first and second lead pins penetrating the stem;
   a mount block fixed to the stem;
   a laser diode having a pair of electrodes, the laser diode having a resistance;
   a submount mounted on the mount block and having an interdigital capacitor and a plurality of electrode patterns on a surface of the submount; and
   a first wire and a second wire electrically connecting the submount to the first and second lead pins, respectively, wherein
   the laser diode is mounted on a first of the plurality of electrode patterns on the submount such that the laser diode and the interdigital capacitor form an electrical circuit,
   the interdigital capacitor has a capacitance selected to reduce signal reflection at a selected frequency; and
   the submount is directly connected to the first and second lead pins by the first and second wires, respectively.

* * * * *